United States Patent
Iwasaki

(10) Patent No.: US 9,117,898 B2
(45) Date of Patent: Aug. 25, 2015

(54) METHOD OF FABRICATING A PLURALITY OF CUT MARKS ON A SUBSTRATE

(71) Applicant: DISCO CORPORATION, Tokyo (JP)

(72) Inventor: Kenichi Iwasaki, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/554,444

(22) Filed: Nov. 26, 2014

(65) Prior Publication Data
US 2015/0155205 A1   Jun. 4, 2015

(30) Foreign Application Priority Data
Dec. 4, 2013   (JP) .................................. 2013-250864

(51) Int. Cl.
| | | |
|---|---|---|
| H01L 21/00 | (2006.01) | |
| H01L 23/34 | (2006.01) | |
| H01L 21/78 | (2006.01) | |
| H01L 23/31 | (2006.01) | |
| H01L 23/00 | (2006.01) | |
| H01L 21/304 | (2006.01) | |
| H01L 23/544 | (2006.01) | |

(52) U.S. Cl.
CPC ............ *H01L 21/78* (2013.01); *H01L 21/3043* (2013.01); *H01L 23/3114* (2013.01); *H01L 23/544* (2013.01); *H01L 24/82* (2013.01); *H01L 24/83* (2013.01)

(58) Field of Classification Search
CPC ....... H01L 24/82; H01L 24/83; H01L 23/544; H01L 21/78; H01L 21/3043
See application file for complete search history.

(56) References Cited

U.S. PATENT DOCUMENTS

| | | | | |
|---|---|---|---|---|
| 7,060,528 | B2 * | 6/2006 | Nishikawa et al. | 438/110 |
| 7,335,578 | B2 * | 2/2008 | Fukuoka et al. | 438/464 |
| 7,521,335 | B2 * | 4/2009 | Yamanaka | 438/458 |
| 8,759,119 | B2 * | 6/2014 | Maruyama et al. | 438/15 |
| 2002/0004288 | A1 * | 1/2002 | Nishiyama | 438/464 |
| 2002/0019066 | A1 * | 2/2002 | Iketani | 438/14 |
| 2003/0166313 | A1 * | 9/2003 | Nishikawa et al. | 438/118 |
| 2005/0009237 | A1 * | 1/2005 | Yamaguchi | 438/114 |
| 2010/0327464 | A1 * | 12/2010 | Sasaki et al. | 257/777 |
| 2012/0292789 | A1 * | 11/2012 | Sazawa | 257/797 |

FOREIGN PATENT DOCUMENTS

JP    2009-253058    10/2009

* cited by examiner

*Primary Examiner* — Alonzo Chambliss
(74) *Attorney, Agent, or Firm* — Greer Burns & Crain Ltd.

(57) ABSTRACT

A processing method for a package substrate composed of a substrate, a plurality of device chips mounted on the substrate in a plurality of separate device regions defined by a plurality of crossing division lines, and a sealing layer for sealing the device chips. The processing method includes a cut mark forming step of moving a cutting blade to cut into the package substrate from the side of the substrate in the regions other than the device regions to the depth passing through the sealing layer, thereby forming a cut mark having a predetermined positional relation to the division lines, and a cutting step of cutting the package substrate from the side of the sealing layer along the division lines by using the cutting blade according to the cut mark after performing the cut mark forming step.

2 Claims, 5 Drawing Sheets

METHOD OF FABRICATING A PLURALITY OF CUT MARKS ON A SUBSTRATE

BACKGROUND OF THE INVENTION

1. Field of the Invention

The present invention relates to a processing method for a package substrate.

2. Description of the Related Art

Known is a package substrate such as a CSP (Chip Size Package) substrate composed of a substrate, a plurality of device chips mounted on the substrate in a plurality of separate device regions defined by a plurality of crossing division lines, and a sealing layer formed of resin for sealing the device chips. The package substrate is divided along the division lines by a cutting apparatus, thereby obtaining a plurality of individual packages having the same size as that of each device chip.

As a general dividing method for the package substrate, the package substrate is held by holding means (chuck table) in the condition where the sealing layer is in contact with the holding means and the substrate is exposed. In this condition, alignment is performed according to electrodes, bumps, etc. provided on the substrate, and the substrate is next cut along the division lines to obtain the individual packages.

SUMMARY OF THE INVENTION

However, in the case of preventing the deposition of cut dust generated by cutting to the bumps, electrodes, etc. provided on the substrate or in order to prevent the corrosion of the electrodes due to a cutting water usually provided by a pure water, there is a case that the package substrate is cut in the condition where the substrate is held by the holding means and the sealing layer is exposed.

In this case, there is no mark as the reference for alignment on the sealing layer. Accordingly, the package substrate is conventionally cut by the following method. For example, the distance from the peripheral edge of the package substrate to the division line adjacent thereto is preliminarily measured. Thereafter, the package substrate is cut according to this distance and the index amount as the distance between the division lines adjacent to each other. However, such a conventional cutting method has a problem such that the measured distance from the peripheral edge of the package substrate to the division line adjacent thereto must be specified for every package substrate at starting the cutting, which is very troublesome.

It is therefore an object of the present invention to provide a package substrate processing method which can easily cut a package substrate from the side of a sealing layer.

In accordance with an aspect of the present invention, there is provided a processing method for a package substrate composed of a substrate, a plurality of device chips mounted on the substrate in a plurality of separate device regions defined by a plurality of crossing division lines, and a sealing layer for sealing the device chips. The processing method includes: a cut mark forming step of moving a cutting blade to cut into the package substrate from the side of the substrate in the regions other than the device regions to the depth passing through the sealing layer, thereby forming a cut mark having a predetermined positional relation to the division lines; and a cutting step of cutting the package substrate from the side of the sealing layer along the division lines by using the cutting blade according to the cut mark after performing the cut mark forming step.

Preferably, the cut mark to be formed in the cut mark forming step includes a plurality of cut marks respectively corresponding to the plural division lines.

In the processing method according to the present invention, the cut mark corresponding to any one of the division lines is formed on the sealing layer before cutting the package substrate from the side of the sealing layer. For example, the cut mark is formed so as to have a predetermined positional relation to the division lines. Accordingly, it is unnecessary to specify a cutting position for every package substrate in cutting, so that the package substrate can be cut from the side of the sealing layer more easily.

Further, in general, the package substrate is expanded or contracted due to heating in a chip sealing step using a sealing material or due to a difference in coefficient of thermal expansion between the substrate and the sealing material. Accordingly, when the package substrate is cut according to the index amount, there is a possibility that unwanted regions other than the division lines may be cut to cause damage to the chips. In contrast, when the plural cut marks are formed so as to respectively correspond to the plural division lines according to the present invention, the division lines can be cut more precisely in the cutting step in spite of the occurrence of expansion or contraction of the package substrate, thereby reducing the possibility of damage to the chips.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
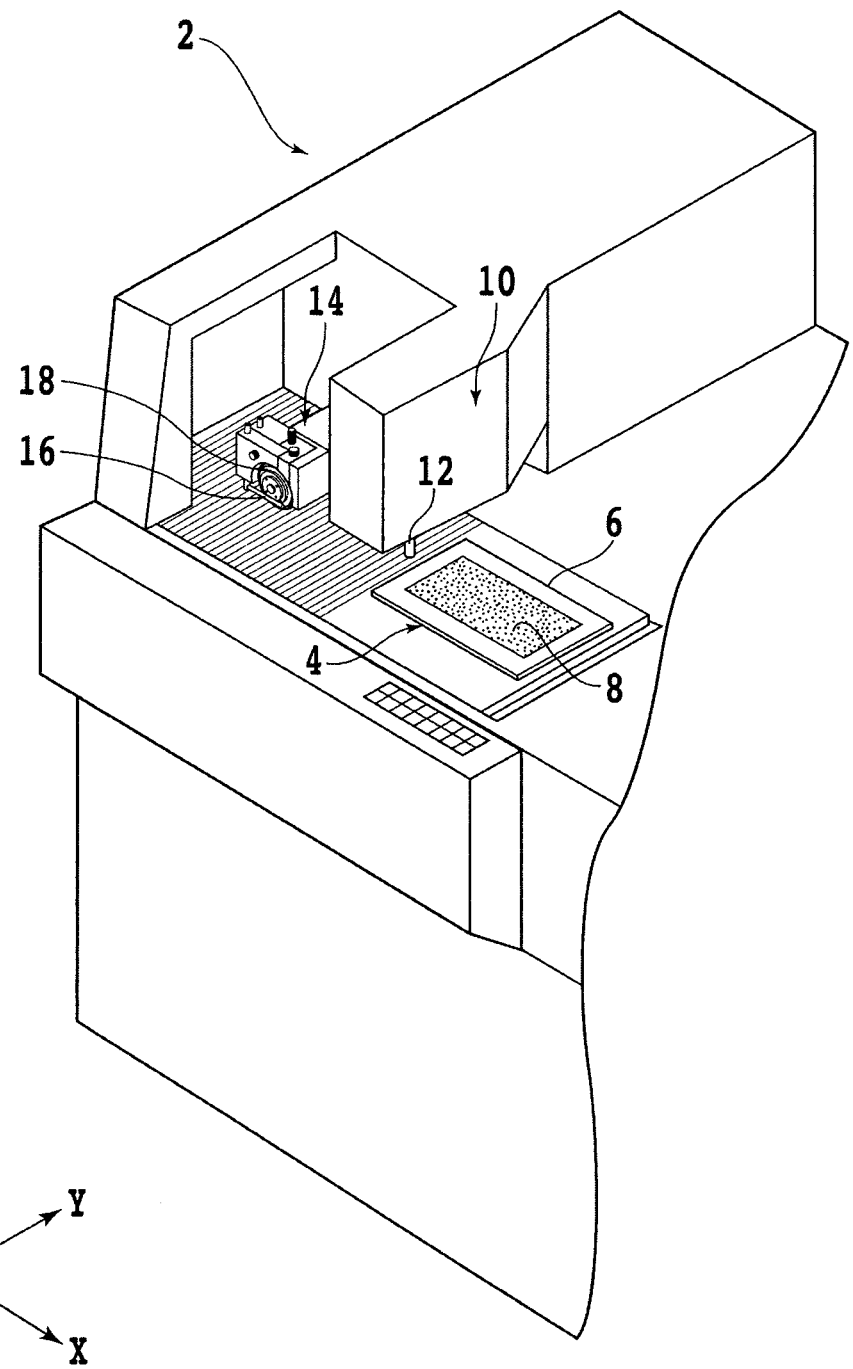
FIG. 1 is a partially cutaway perspective view of a cutting apparatus for performing a package substrate processing method according to a preferred embodiment of the present invention.

A preferred embodiment of the present invention will now be described in detail with reference to the drawings. Referring to FIG. 1, there is shown a partially cutaway perspective view of a cutting apparatus 2 for performing a package substrate processing method according to a preferred embodiment of the present invention. The cutting apparatus 2 shown in FIG. 1 includes a chuck table (holding means) 4 for holding a workpiece under suction. The chuck table 4 includes a frame 6 formed of metal and a suction holding portion 8 surrounded by the frame 6. The suction holding portion 8 is formed of a porous material such as porous ceramics. The suction holding portion 8 is connected selectively through an electromagnetic valve to suction means (not shown). The chuck table 4 is rotatable and movable back and forth in the X direction.

There is provided above the path of movement of the chuck table 4 in the X direction an alignment unit 10 for detecting the division lines of the workpiece held on the chuck table 4 under suction, wherein the workpiece is to be cut along the division lines. The alignment unit 10 includes an imaging unit 12 for imaging the front side of the workpiece. The imaging unit 12 has a microscope and a CCD camera. Accordingly, the division lines to be cut can be detected by performing image processing such as pattern matching according to an image obtained by the imaging unit 12.

A cutting unit 14 for cutting the workpiece held on the chuck table 4 is provided on the left side of the alignment unit 10 as viewed in FIG. 1. The cutting unit 14 is integrated with the alignment unit 10, and they are adapted to be moved together in the Y direction and the Z direction. The cutting unit 14 includes a rotatable spindle 16 and a cutting blade 18 mounted on the front end of the spindle 16. The cutting unit 14 is movable in the Y direction and the Z direction. The cutting blade 18 is positioned on the extension line extending from the imaging unit 12 in the X direction.

Figure 2A:
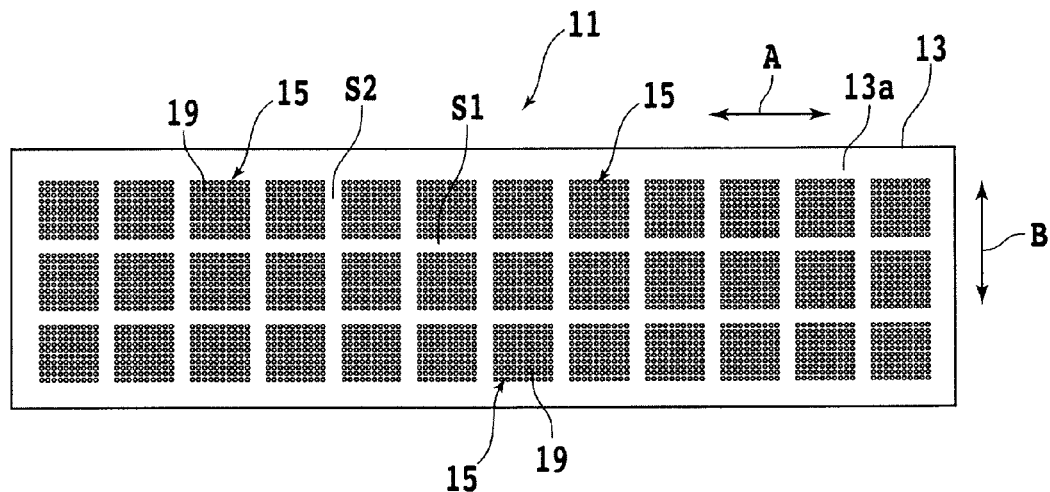
FIG. 2A is a plan view showing the front side of a package substrate.
Figure 2B:
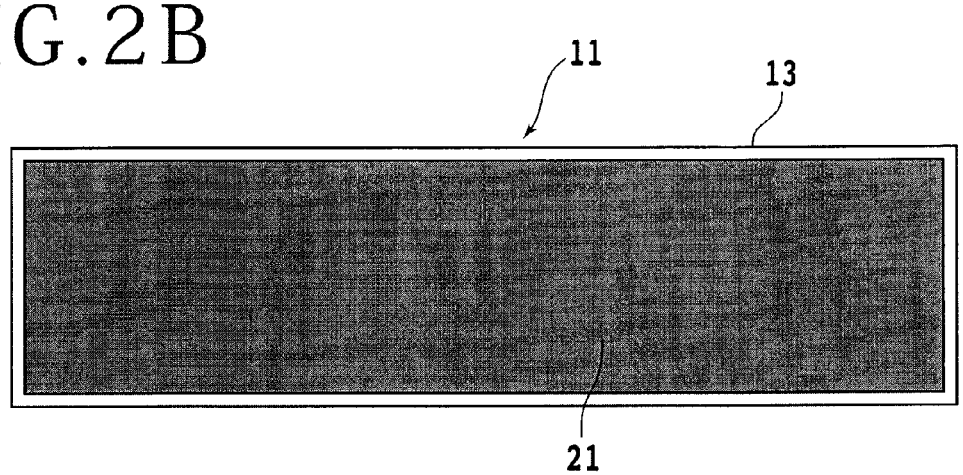
FIG. 2B is a plan view showing the back side of the package substrate.
Figure 2C:
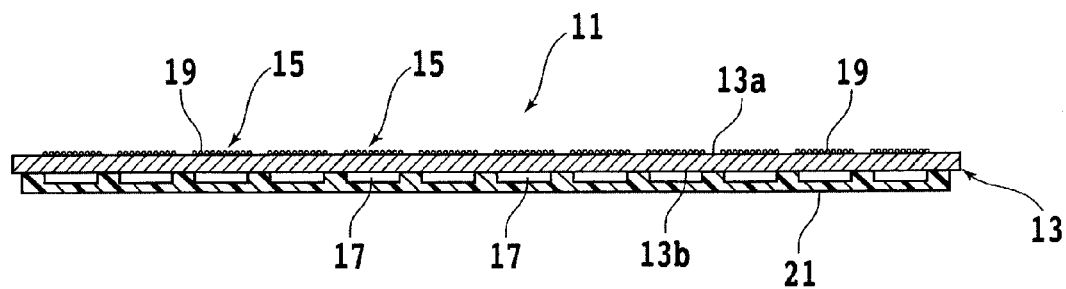
FIG. 2C is a sectional view of the package substrate.

There will now be described a package substrate 11 as the workpiece to be processed by the present invention with reference to FIGS. 2A to 2C. FIG. 2A is a plan view showing the front side of the package substrate 11, FIG. 2B is a plan view showing the back side of the package substrate 11, and FIG. 2C is a sectional view of the package substrate 11. The package substrate 11 is composed of a substrate 13, a plurality of device chips 17 mounted on the back side 13b of the substrate 13 in a plurality of separate regions respectively corresponding to a plurality of separate device regions 15 defined by a plurality of crossing division lines (streets) S1 and S2 on the front side 13a of the substrate 13, and a sealing layer 21 for sealing the device chips 17. Preferably, the sealing layer 21 is formed of resin such as epoxy resin.

A plurality of bumps 19 are provided in each device region 15 on the front side 13a of the substrate 13. Each bump 19 is connected through a wiring layer or a through electrode formed in the substrate 13 to the corresponding device chip 17.

In the following description, the division lines S1 extending in the direction shown by an arrow A in FIG. 2A will be referred to as first division lines, whereas the division lines S2 extending in the direction shown by an arrow B perpendicular to the arrow A in FIG. 2A will be hereinafter referred to as second division lines. The package substrate processing method according to this preferred embodiment is performed in the following manner. First, as shown in FIG. 3, an adhesive tape 22 is attached to the back side (the sealing layer 21) of the package substrate 11, and the package substrate 11 is held on the chuck table 4 under suction in the condition where the adhesive tape 22 is in contact with the chuck table 4 and the front side 13a of the substrate 13 is exposed.

Figure 3:
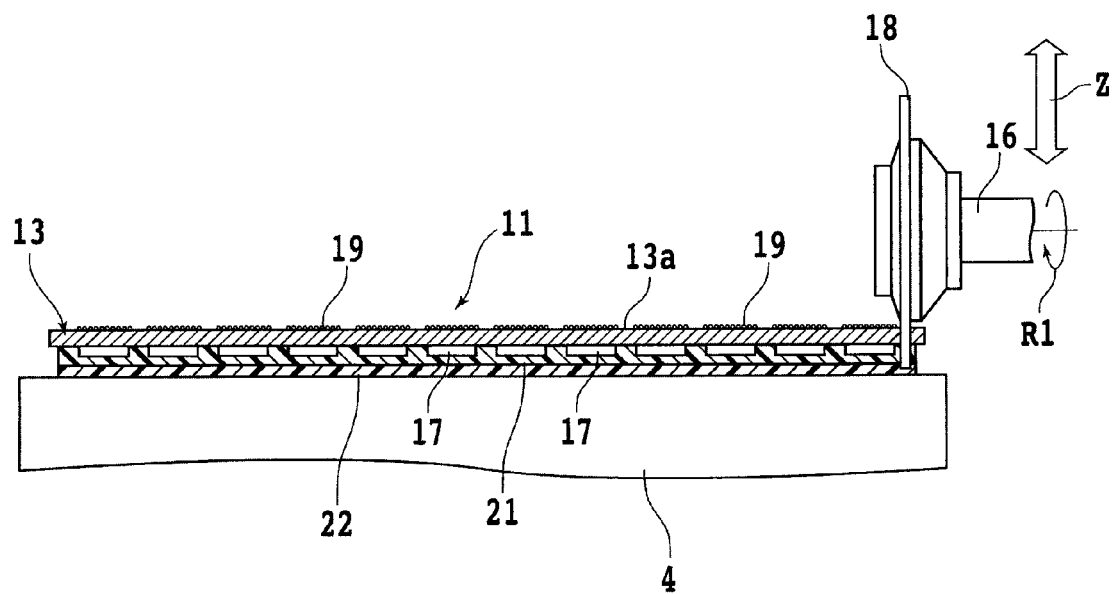
FIG. 3 is a partially sectional side view showing a cut mark forming step.

Thereafter, a cut mark forming step is performed in such a manner that the cutting blade 18 rotating in the direction shown by an arrow R1 in FIG. 3 is moved (lowered) to cut into the package substrate 11 from the front side 13a of the substrate 13 in the regions other than the device regions 15 to the depth passing through the sealing layer 21, thereby forming a cut mark having a predetermined positional relation to the division lines S1 and S2. Preferably, this predetermined positional relation is set so that the cut mark is formed at the position corresponding to any one of the division lines S1 and S2. However, the setting method for the predetermined positional relation is not limited to the above method, but it is essential that the distance from the cut mark to any one of the division lines S1 and S2 is to be determined.

Figure 4A:
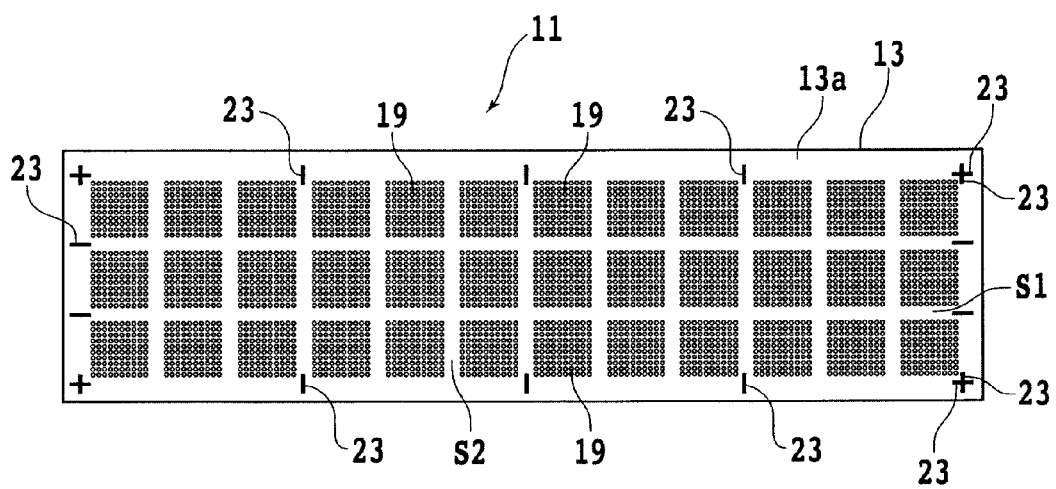
FIG. 4A is a plan view showing the front side of the package substrate processed by the cut mark forming step, wherein typical forming positions of cut marks are shown.

Preferably, as shown in FIG. 4A, a plurality of cut marks 23 are formed so as to correspond to the plural division lines S1 and S2 by moving the chuck table 4 in the X direction and moving the cutting blade 18 in the Y direction and the Z direction. In this preferred embodiment shown in FIG. 4A, the cut marks 23 are formed at the opposite ends of each of all the first division lines S1, whereas the cut marks 23 are formed at the opposite ends of each of the second division lines S2 corresponding to the first, fourth, seventh, tenth, and thirteenth lines as counted from the left end as viewed in FIG. 4A. In cutting the second division lines S2 corresponding to the second and third lines as counted from the left end as viewed in FIG. 4A, the cutting blade 18 is indexed in the Y direction from the first line by the distance obtained by dividing the distance between the first line and the fourth line by the number of chips present therebetween per first division line S1.

Figure 4B:
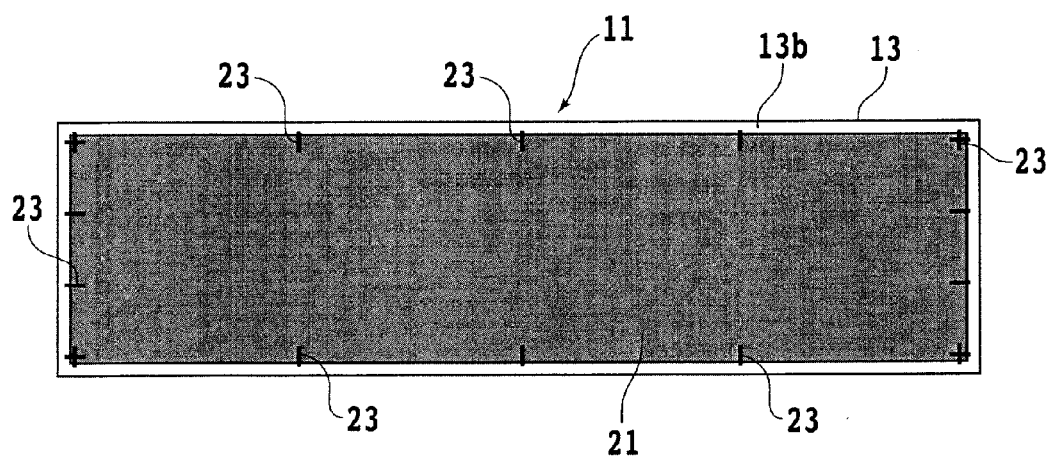
FIG. 4B is a plan view similar to FIG. 4A, showing the back side of the package substrate.

In this cut mark forming step, chopper cut is performed in such a manner that the cutting blade 18 is moved in the Z direction to cut into the package substrate 11 to the depth passing through the sealing layer 21. Accordingly, as shown in FIG. 4B, the cut marks 23 formed on the front side of the package substrate 11 are transferred to the back side of the package substrate 11. Accordingly, the alignment for the cutting blade 18 can be performed according to the cut marks 23 formed on the back side of the package substrate 11. The positions of the cut marks 23 shown in FIGS. 4A and 4B are merely illustrative and the cut marks 23 may be formed at any positions other than the positions shown in FIGS. 4A and 4B. For example, the cut marks 23 may be formed at the opposite ends of each of all the second division lines S2. Further, the cut marks 23 may be formed at the opposite ends of each of the first division lines S2 selected so as to be arranged at given intervals.

By forming the cut marks 23 at the opposite ends of each of the plural division lines S1 and S2 as shown in FIGS. 4A and 4B, the division lines S1 and S2 can be cut more precisely in the subsequent step in spite of the occurrence of expansion or contraction of the package substrate 11, thereby reducing the possibility of damage to the chips. The alignment is performed by operating the imaging unit 12 to image the back side of the package substrate 11 and rotating the chuck table 4 so that the straight line connecting the cut marks 23 formed at the opposite ends of each division line S1 or S2 becomes parallel to the X direction.

Figure 5:
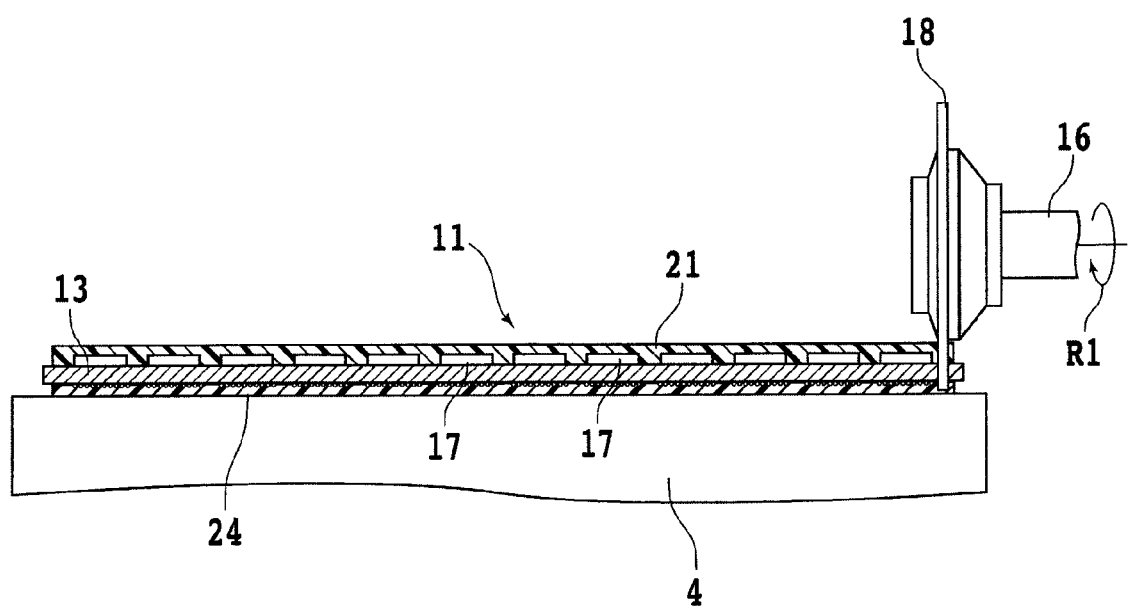
FIG. 5 is a partially sectional side view showing a cutting step.

Referring next to FIG. 5, there is shown a partially sectional side view for illustrating a cutting step. In the cutting step shown in FIG. 5, the adhesive tape 22 is removed from the back side of the package substrate 11, and an adhesive tape 24 is next attached to the front side (the substrate 13 side) of the package substrate 11. Thereafter, the package substrate 11 is held on the chuck table 4 under suction in the condition where the adhesive tape 24 is in contact with the chuck table 4 and the sealing layer 21 is exposed. In cutting the first division line S1, the alignment is first performed according to the cut marks 23 formed at the opposite ends of each first division line S1. Thereafter, the cutting blade 18 rotating at a high speed in the direction shown by an arrow R1 in FIG. 5 is lowered to cut into the package substrate 11 from the sealing layer 21 so as to reach the adhesive tape 24. Thereafter, the chuck table 4 is moved in the X direction to thereby cut the first division line S1 aligned with the cutting blade 18.

In cutting the next first division line S1, the alignment is similarly performed according to the cut marks 23 formed at the opposite ends of the first division line S1 to be cut, and the cutting blade 18 is used to cut the first division line S1 aligned above. In cutting the second division lines S2, the alignment is first performed according to the cut marks 23 formed at the opposite ends of the second division line S2 corresponding to the first line as counted from the left end as viewed in FIG. 4A. Thereafter, the cutting blade 18 is used to cut the second division line S2 aligned above. In cutting the next second division line S2 corresponding to the second line as counted from the left end as viewed in FIG. 4A, the cutting blade 18 is indexed in the Y direction from the first line by the distance obtained by dividing the distance between the first line and the fourth line by the number of chips present therebetween per first division line S1 (three in the case of FIG. 4A). Thereafter, the chuck table 4 is moved in the X direction to cut the second division line S2. Also in cutting the next second division line S2 corresponding to the third line as counted from the left end as viewed in FIG. 4A, the cutting blade 18 is similarly indexed to cut this second division line S2 corresponding to the third line.

In cutting the second division line S2 corresponding to the fourth line as counted from the left end as viewed in FIG. 4A, the alignment is performed according to the cut marks 23 formed at the opposite ends of the second division line S2 corresponding to the fourth line. Thereafter, the cutting blade 18 is used to cut the second division line S2 aligned above. While the cutting blade 18 used in the cutting step is the same as that used in the cut mark forming step in this preferred embodiment, a different cutting blade may be used in the cutting step.

Further, in the above preferred embodiment, the adhesive tapes 22 and 24 are attached to the package substrate 11 and the package substrate 11 is held on the chuck table 4 under suction through the adhesive tape 22 or 24. As a modification, the package substrate 11 may be mounted on a jig table having clearance grooves corresponding to the division lines S1 and S2 without the use of adhesive tapes, and this jig table may be held under suction by any suction means included in the cutting apparatus 2. In this case, this suction means is different in structure from the chuck table 4 shown in FIG. 1. For example, a suction table as disclosed in Patent Document 1 is preferably used as this suction means.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a package substrate composed of a substrate, a plurality of device chips mounted on the substrate in a plurality of separate device regions defined by a plurality of crossing division lines, and a sealing layer for sealing the device chips, the processing method comprising:
    a cut mark forming step of moving a cutting blade to cut into the package substrate from a side of the substrate in the regions other than the device regions to a depth passing through the sealing layer, thereby forming a cut mark having a predetermined positional relation to the division lines; and
    a cutting step of cutting the package substrate from the side of the sealing layer along the division lines by using the cutting blade according to the cut mark after performing the cut mark forming step.

2. The processing method for a package substrate according to claim 1, wherein the cut mark to be formed in the cut mark forming step includes a plurality of cut marks respectively corresponding to the plural division lines.

* * * * *